United States Patent
Zhu et al.

(10) Patent No.: US 7,037,592 B2
(45) Date of Patent: May 2, 2006

(54) HYBRID COMPOSITE OF SILICONE AND ORGANIC RESINS

(75) Inventors: Bizhong Zhu, Midland, MI (US); Herschel H. Reese, Midland, MI (US); Dimitris E. Katsoulis, Midland, MI (US); John R. Keryk, Midland, MI (US); Yuhong Wu, Cambridge, MA (US); Frederick J. McGarry, Weston, MA (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 10/374,802

(22) Filed: Feb. 25, 2003

(65) Prior Publication Data

US 2004/0166332 A1    Aug. 26, 2004

(51) Int. Cl.
*B32B 13/12*    (2006.01)
(52) U.S. Cl. ............... 428/451; 428/524; 428/413; 428/500; 528/31; 528/32; 528/33
(58) Field of Classification Search ............... 428/448, 428/451, 413, 500, 524; 528/31, 32, 33
See application file for complete search history.

(56) References Cited

U.S. PATENT DOCUMENTS

| | | | | |
|---|---|---|---|---|
| 4,332,525 A | * | 6/1982 | Cheney, Jr. | ............. 416/134 A |
| 5,278,272 A | | 1/1994 | Lai et al. | |
| 5,747,608 A | | 5/1998 | Katsoulis et al. | |
| 6,310,146 B1 | * | 10/2001 | Katsoulis et al. | ............ 525/477 |
| 6,660,395 B1 | * | 12/2003 | McGarry et al. | ............ 428/447 |
| 6,689,859 B1 | | 2/2004 | Li et al. | |

* cited by examiner

*Primary Examiner*—Kuo-Liang Peng
(74) *Attorney, Agent, or Firm*—Gifford, Krass, Groh, Sprinkle, Anderson & Citkowski, P.C.

(57) ABSTRACT

A fiber reinforced composite including layers of fibers, each layer being impregnated with a resin. The layers include in combination a layer of an addition cured silicone resin and a layer of an organic resin. The layers form a hybrid composite having a higher modulus retention at elevated temperatures than the addition cured silicone resin alone. The hybrid composite's mechanical properties are similar to the organic resin composite, but demonstrate enhanced thermal resistance and reduced flammability.

18 Claims, 1 Drawing Sheet

Figure 1.

HYBRID COMPOSITE OF SILICONE AND ORGANIC RESINS

FIELD OF THE INVENTION

This invention pertains to silicone resin based composites. More specifically, this invention relates to resin composites having a rigid silicone matrix resin and an organic resin.

BACKGROUND OF THE INVENTION

Fiber reinforced, silicone matrix resin composites find many applications in non-structural, semi-structural and structural components. The fiber reinforcement often takes the form of woven fiberglass fabrics. Woven carbon fiber mats offer a higher modulus reinforcing media but they are more expensive than glass fibers. Other fiber compositions such as aramid, nylon, polyester and quartz fibers may be used. Other fibrous forms, such as non-woven mats and layers of loose fibers, may also be used in silicone resin based composite applications.

A large family of silicone matrix resins is available for composite applications. Such resins are typically highly cross-linked polymer molecules in cured form. They are substantially rigid materials displaying a respectable modulus of elasticity.

These fiber reinforced, silicone matrix resin composites in multi-layer laminated form are strong and fire resistant and find applications such as interiors for airplanes and ships. They are also used in electrical applications, such as wiring boards and printed circuit boards, requiring low dielectric constant, low dielectric dissipation, and low moisture pick up.

Silsesquioxane resins have seen increased use in industrial applications in transportation (automotive, aerospace, naval) and other industries. Silsesquioxane resins exhibit excellent heat and fire resistance, as well as low smoke generation and low smoke toxicity that are desirable for such applications. These properties make the silsesquioxane resins attractive for use in fiber-reinforced composites for electrical laminates, automotive components, aircraft interior and ship interior and deck.

However, there is a need in the art for composite materials that exhibit excellent flame and smoke properties as well as retain their strength and modulus at elevated temperatures.

Therefore, it is an object of this invention to provide a composite material that retains strength and modulus at elevated temperatures, at the same time demonstrates a high thermal resistance and reduced flammability, as well as reduced smoke/smoke toxicity.

SUMMARY OF THE INVENTION

A fiber reinforced composite including a plurality of layers of fibers, each layer being impregnated with a resin. The plurality of layers includes in combination a layer(s) of an addition cured or condensation cured silicone resin and a layer(s) of an organic resin. The layers form a hybrid composite having a higher modulus retention at elevated temperatures than the silicone resin alone, having other mechanical properties similar to the organic resin composite, but exhibiting much enhanced thermal resistance and reduced flammability.

DETAILED DESCRIPTION OF THE PREFERRED EMBODIMENTS

This invention relates to a fiber reinforced composite having both an organic resin and toughened silicone resin utilized to form the composite structure. Toughened silicone resins include addition cured and condensation cured silicone resins. A preferred toughened silicone resin generally comprises a hydrosilylation reaction curable composition that is used to prepare a cured silsesquioxane resin. A preferred toughened resin composition comprises: (A) a silsesquioxane copolymer, (B) a mixture of silanes or siloxanes as a cross-linker, (C) a compound catalyst, (D) an optional reaction inhibitor and (E) an optional solvent.

Component (A) is a silsesquioxane copolymer comprising units that have the empirical formula $R^1_a R^2_b R^3_c SiO_{(4-a-b-c)/2}$, wherein: a is zero or a positive number, b is zero or a positive number, c is zero or a positive number, with the provisos that $0.8 \leq (a+b+c) \leq 3.0$ and component (A) has an average of at least 2 $R^1$ groups per molecule, and each $R^1$ is independently selected from monovalent hydrocarbon groups having aliphatic unsaturation, and each $R^2$ and each $R^3$ are independently selected from monovalent hydrocarbon groups and hydrogen. Preferably, $R^1$ is an alkenyl group such as vinyl or allyl. Typically, $R^2$ and $R^3$ are nonfunctional groups selected from the group consisting of alkyl and aryl groups. Suitable alkyl groups include methyl, ethyl, isopropyl, n-butyl, and isobutyl groups. Suitable aryl groups include phenyl groups. Suitable silsesquioxane copolymers for component (A) are exemplified by $(PhSiO_{3/2})_{0.75}(ViMe_2SiO_{1/2})_{0.25}$, where Ph is a phenyl group, Vi represents a vinyl group, and Me represents a methyl group.

Component (B) is a silane or a mixture of silanes and/or siloxanes that contain silicon hydride functionalities that will crosslink with the vinyl group of component (A). The silanes or siloxanes utilized in the mixture should have at least two Si—H or silicon hydride functionalities and can be represented by the general formula: For the silanes: $H_a R^1_b SiR^2 SiR^3_c H_d$, where $2 \geq a$ or $d \geq 1$, $2 \geq b$ or $c \geq 1$, $a+b=c+d=3$, and $R^1$, $R^2$ and $R^3$ are hydrocarbons: or $H_a R^1_b R^2_c Si$ wherein $a \geq 2$ and $R^1$ and $R^2$ are hydrocarbon for the silane.
For the siloxanes:
$H_a R^1_b Si_c O_{(4c-a-b)/2}$, where $a \geq 2$, $b \geq 4$, $c \geq 2$ and $R^1$ is a hydrocarbon.

Components (A) and (B) are added to the composition in amounts such that the molar ratio of silicon bonded hydrogen atoms (SiH) to unsaturated groups (C=C) (SiH:C=C) ranges from 1.0:1.0 to 1.5:1.0. Preferably, the ratio is in the range of 1.1:1.0 to 1.5:1.0. If the ratio is less than 1.0:1.0, the properties of the cured silsesquioxane resin will be compromised because curing will be incomplete. The amounts of components (A) and (B) in the composition will depend on the number of C=C and Si—H groups per molecule. However, the amount of component (A) is typically 50 to 90 weight % of the composition, and the amount of component (B) is typically 2 to 50 weight % of the composition.

Component (C) is a hydrosilylation reaction catalyst. Typically, component (C) is a platinum catalyst added to the composition in an amount sufficient to provide 1 to 100 ppm of platinum based on the weight of the composition. Component (C) is exemplified by platinum catalysts such as chloroplatinic acid, alcohol solutions of chloroplatinic acid, dichlorobis(triphenylphosphine)platinum(II), platinum chloride, platinum oxide, complexes of platinum compounds with unsaturated organic compounds such as olefins, complexes of platinum compounds with organosiloxanes containing unsaturated hydrocarbon groups, such as Karstedts catalyst (i.e. a complex of chloroplatinic acid with 1,3-divinyl-1,1,3,3-tetramethyidisiloxane) and 1,3-diethenyl-1,1,3,3-tetramethyldisiloxane, and complexes of platinum compounds with organosiloxanes, wherein the complexes are embedded in organosiloxane resins. A particularly preferred catalyst is a 1% platinum-divinyltetramethyldisiloxane complex commercially available from Chemical Technologies, Inc. of Bristol, Pa.

Component (D) may include an optional catalyst inhibitor, typically added when a one part composition is prepared. Suitable inhibitors are disclosed in U.S. Pat. No. 3,445,420 to Kookootsedes et al., May 20, 1969, which is hereby incorporated by reference for the purpose of describing catalyst inhibitors. Component (D) is preferably an acetylenic alcohol such as methylbutynol or ethynyl cyclohexanol. Component (D) is more preferably ethynyl cyclohexanol. Other examples of inhibitors include diethyl maleate, diethyl fumamate, bis (2-methoxy-1-methylethyl) maleate, 1-ethynyl-1-cyclohexanol, 3,5-dimethyl-1-hexyn-3-ol, 2-phenyl-3-butyn-2-ol, N,N,N',N'-tetramethylethylenediamine, ethylenediamine, diphenylphosphine, diphenylphosphite, trioctylphosphine, triphenylphosphine, diethylphenylphosphonite, and methyldiphenylphosphinite.

Component (D) is present at 0 to 0.05 weight % of the hydrosilylation reaction curable composition. Component (D) typically represents 0.0001 to 0.05 weight % of the curable composition. Component (D) preferably represents 0.0005 to 0.01 weight percent of the total amount of the curable composition. Component (D) more preferably represents 0.001 to 0.004 weight percent of the total amount of the curable composition.

Components (A), (B), (C) and (D) comprise 10 to 99.9 weight % of the composition. The composition may further comprise one or more optional components such as reaction inhibitors, processing additives or other components known in the art.

The hydrosilylation reaction curable composition comprising components (A), (B), and (C), and any optional components can be dissolved in component (E), an optional solvent. Typically, the amount of solvent is 0 to 90 weight %, preferably 0 to 50 weight % of the curable composition. The solvent can be an alcohol such as methyl, ethyl, isopropyl, and t-butyl alcohol; a ketone such as acetone, methylethyl ketone, and methyl isobutyl ketone; an aromatic hydrocarbon such as benzene, toluene, and xylene; an aliphatic hydrocarbon such as heptane, hexane, and octane; a glycol ether such as propylene glycol methyl ether, dipropylene glycol methyl ether, propylene glycol n-butyl ether, propylene glycol n-propyl ether, and ethylene glycol n-butyl ether; a halogenated hydrocarbon such as dichloromethane, 1,1,1-trichloroethane and methylene chloride; chloroform; dimethyl sulfoxide; dimethyl formamide; acetonitrile and tetrahydrofuran. A preferred solvent is toluene.

It should be realized that the silicone resins mixed with any Si—H functional cross-linkers can be used as a continuous phase for fiber reinforced composites. Such fiber reinforcements can include any common reinforcement fibers such as quartz, glass, graphite, etc.

In an alternative embodiment the silicone resin is a condensation cured resin comprising an organosilicone composition selected from the group consisting of:

(I) an organosilicone resin of the empirical formula $R^1_a R^2_b R^3_c SiO_{(4-a-b-c)/2}$ wherein: a is a positive numerical value, b and c are zero or positive numerical values with the proviso that $0.8 \leq (a+b+c) \leq 1.6$, $R^1$, $R^2$ and $R^3$ are monovalent radicals independently selected from the group consisting of hydrogen, hydroxyl, alkyl, alkenyl, alkoxy, oximo, alkyloximo, aryloximo, aryl, alkylepoxide, arylepoxide, alkylcarboxyl, arylcarboxyl, alkylether, arylether, alkylamide, arylamide, alkyl amino and arylamino radicals; and (II) hydrolyzable precursors of (I); and (III) an hydrolyzate formed from (II).

Optionally included may be (B) a silicone rubber of the empirical formula:

wherein each $R^4$ is a monovalent radical independently selected from the group consisting of alkyl and aryl radicals, each $R^5$ is a monovalent radical independently selected from the group consisting of hydrogen, hydroxyl, alkenyl, alkoxy, oximo, alkyloximo, aryloximo, alkylepoxide, arylepoxide, alkylcarboxyl, arylcarboxyl, alkylamide, arylamide, alkyl amino and arylamino radicals, p is 1, 2 or 3, q is 1 or 2, x is greater than or equal to 6, and y ranges from zero to 10.

For condensation-cure systems, metal esters or alkoxides of tin, titanium and zinc are all preferred catalysts. Titanium tetrabutoxide, dibutyl tin dilaurate and zinc octoate are well-known examples. Tin catalysts, however, tend to decrease the thermal stability of the cured rubber-modified rigid resins of the invention and should be avoided for high temperature applications. Even less preferred but still usable are strong acids and bases, such as sulfuric acid, phosphoric acid, potassium hydroxide, cesium hydroxide, metal silanolates and calcined lime. These latter catalysts likewise compromise the thermal stability of cured rigid silicone castings. Also useful are amine and metal carboxylates and quaternary bases. Those skilled in the art will recognize that certain quaternary bases, such as tetramethyl ammonium hydroxide, have the advantage that they decompose to volatile by-products when heated to curing temperatures, and are thus readily removed from the silicone resin/rubber copolymer matrix of the invention.

The types of organic resins suitable for use in the composite of the present invention include vinyl ester resins, epoxy resins, phenolic resins, cyanate ester resins and silicone resins having a higher glass transition temperature than the toughened silicone resin.

A preferred vinyl ester resin is sold under the trade name Derkane Momentum™, and is an epoxy vinyl ester resin that can be cured with 0.5 weight percent benzoyl peroxide and 0.06 weight percent diethylaniline as curing agents and is commercially available from Dow Chemical.

A preferred epoxy resin for use by the present invention is sold under the trade name Novalac™ and comprises an epoxy resin that can be cured by 35.5 weight percent diaminodiphenylsulfone as a curing agent and is commercially available from Dow Chemical.

A preferred phenolic resin includes a phenolic resin/7781 fiber glass pre-preg commercially available from Cytec Engineered Materials.

A preferred high glass transition temperature resin is exemplified by the formula $(R1R2_2SiO_{1/2})_{0.15} (R2SiO_{3/2})_{0.75} (SiO_{4/2})_{0.10}$ wherein R1 is a vinyl group and R2 is a methyl or phenyl group. The molar percentage of $SiO_{4/2}$ is between 5 to 30 percent, that of $R1R2_2SiO_{1/2}$ is between 10 to 30 percent with the remainder comprising $R2SiO_{3/2}$. In a preferred embodiment a resin of the formula $(ViMe_2SiO_{1/2})_{0.15} (PhSiO_{3/2})_{0.75} (SiO_{4/2})_{0.10}$ is utilized.

The fiber component of the composites will usually be glass or carbon because of favorable cost and availability, but other fiber reinforcing materials are suitable for many applications. For example, quartz fibers and aramid, nylon and polyester fibers may be used. Woven fiberglass fabrics are usually preferred for ordinary applications where cost is an important consideration. Non-woven fiber mats and loose fiber layers are also suitable.

The fibrous reinforcing material, while a necessary component of the composite is not limited to a certain variety or type of fiber. In a preferred aspect of the invention, the 7781 glass fabric commercially available from Hexcel Schwebel is utilized. Such woven structures are easy to impregnate with the resins and can be used to form prepregs suitable for curing to form the composite material of the present invention. Other forms and fiber compositions may be used without changing the basic strategy of the invention.

Various structures of layers and methods of curing of the resins may be utilized by the present invention. The composite of the present invention may comprise a plurality of layers of fibers impregnated with the various resins of the invention which are arranged to produce desired properties. Various arrangements of the layers include: alternating the toughened silicone and organic layers such that the toughened silicone layers are on the outside of the composite surface, creating a core of organic layers surrounded by layers of the toughened silicone resin, creating a core of alternating layers of organic and toughened silicone resins surrounded by layers of toughened silicone resin, or creating a core consisting of honeycomb and organic resin impregnated layers on both sides of the honeycomb. The honeycomb structure employed in a preferred aspect of the invention can be formed from metals such as aluminum, paper, polymer, or fiber reinforced polymers as the walls. In addition to a honeycomb structured core, other light weight cores containing various types of cell configurations including, for example, randomly or regularly dispersed spheres can be used. A core structure with cells having a hexagonal configuration is preferably utilized.

The thickness, as well as the number of the individual layers of organic and toughened silicone resins can vary with respect to each other, to provide for a variety of composite structures. The toughened silicone resin is preferably applied as the outside layers of the composite to provide the increased flame resistance and smoke properties desired of the composite material. The toughened silicone resin can be in the form of layers of prepreg material that has been impregnated with the toughened silicone resin or it can be applied to a surface of a cured or uncured prepreg of the organic resin.

The resins of the present invention can be applied to fiber sheets to form prepreg sheets that can be cured sequentially or concurrently to form the composite of the present invention. For example in a concurrent curing process, a composite structure having a core of organic layers of from 4 to 10 layers, preferably of from 6 to 8 layers can be co cured with toughened silicone layers varying from 2 to 8 layers, in one step, to form the composite of the present invention. Alternatively, in a sequential curing process, the core of organic resin can be cured and layers of the toughened silicone resin can be applied by laying down silicone resin impregnated reinforcement onto the surface of the cured organic core, or by spraying onto the surface of the cured resin. The toughened silicone resin can then be cured to form the composite of the present invention.

EXAMPLES

The following examples are intended to illustrate the invention to those skilled in the art and should not be interpreted as limiting the scope of the invention as set forth in the appended claims.

Reference Example 1

Three Point Flexural Testing

The three point bending test was performed on an Instron 4500 per ASTM standard D 790-961. The cured resin specimens prepared in the Examples described below were cut into 5.08 cm×1.27 cm specimens using a band saw. The specimens were then machined to a thickness of 0.25 cm and polished. The specimens were tested using a cross head speed of 1 mm/min and a support span of 3.81 cm.

During testing, force-displacement curves were recorded. The toughness of the cured resin was obtained as the area under the stress-strain curves. The flexural strength was calculated using the peak force as:

$$S=3PL/2bd^2$$

where S is the stress in the outer surface at the mid span, P the maximum load, L the support span, and b and d are the width and thickness of the beam. The maximum strain was calculated, using the maximum displacement, as:

$$\epsilon=6Dd/L^2$$

where $\epsilon$ is the strain at break and D is the maximum displacement. The slope of the steepest initial straight-line portion of the load-displacement curve was taken as the Young's modulus.

Reference Example 2

Fracture Toughness Testing

The plane strain fracture toughness, $K_{Ic}$, was obtained per ASTM D 5045-96, and the critical strain energy release rate, $G_{Ic}$, was calculated from $K_{Ic}$ based on Linear Elastic Fracture Mechanics (LEFM) assumptions. 5.08cm×0.95 cm samples were cut using a band saw and a notch was cut at the center of the specimen. A natural crack extending from the root of the notch to about half of the width was produced by gently tapping a sharp razor blade into the notch. Samples were conditioned at 73° C. for at least twenty-four hours before testing to allow full relaxation of deformation. The displacement rate of the test was 10 mm/minute with a support span of 3.81 cm.

$$K_{Ic}=(P/(BW^{1/2}))f(x)$$

where P is the highest load and:

$$f(x)=6x^{1/2}(1.99-x(1-x)(2.15-3.93x+2.7x^2))/((1+2x)(1-x)^{3/2})$$

where x is the pre-crack to specimen width ratio, a/W. After the test the pre-crack length was measured. Only those specimens with a value between 0.45 to 0.55 were considered valid. The variation of x across the thickness should be less than 10%. The validity of the test was further ensured by comparing the sample dimensions with the estimated plastic zone size enlarged by approximately 50:

$$B,a,(W-a)>2.5(K_{Ic}/\gamma_y)^2$$

where $\gamma_y$ is the yield stress of the sample.

$G_{Ic}$, was calculated by:

$$G_{Ic}=K^2_{Ic}(1-v^2)/E$$

where upsilon, the Poisson's ratio of the resin, was neglected to simplify the experiment. For a glassy polymer with a Poisson's ratio of 0.3, $G_{Ic}$ was exaggerated by about 9%. However, the relative ranking of $G_{Ic}$ values would not be obscured since the change of the square of the Poisson's ratio is usually small from one resin to another of similar stiffness.

Reference Example 3

Dynamic Mechanical Analysis

Dynamic mechanical analysis was carried out on a TA Instrument DMA 2980. A specimen 20 mm long, 4 mm wide and 1 mm thick was mounted in two grips 14 mm apart. The specimen was then subjected to a sinusoidal tensile displacement at a frequency of 1 Hertz. The tension was measured and the storage and loss moduli and the loss factor were calculated. The tests were performed at temperatures ranging from −150 to 400° C. All tests were performed in a nitrogen environment with a gas flow rate of 200 ml/min.

Example 1

Various composite structures were prepared according to the forgoing description of the specification. Specifically a toughened silicone resin such as the 2672 and 233T resins listed in Table 1 were utilized in combination with various organic resins, such as the vinyl ester and epoxy resins listed in Table 1. Various properties of the organic resins are listed in Table 2.

The addition cure silicone resin used in the example comprises a silsesquioxane resin of the formula $(PhSiO_{3/2})_{0.75}(ViMe_2SiO_{1/2})_{0.25}$ crosslinked with various crosslinkers and the condensation cure silicone resin comprises a resin of the formula $(MeSiO_{3/2})_{0.40}(PhSiO_{3/2})_{0.45}(PhMeSiO)_{0.05}(Ph_2SiO)_{0.1}$ toughened by molecular incorporation of 10 wt.% polydimethylsiloxane with an average degree of polymerization of 55.

Various layer structures of the toughened silicone resin and organic resin were prepared for testing at different temperatures. The composite was either prepared concurrently, where prepregs of the various resins were prepared and laid up and cured at the same time or sequentially where the toughened silicone resin is applied onto a cured organic structure and then cured. The prepregs of the examples comprise 7781 fiberglass fabric, as described above and are impregnated with the appropriate organic or toughened silicone resin.

An exemplary curing cycle for the concurrent and sequential curing of the composite having the addition cure silicone resin and an organic resin of a cyanate ester is as follows: A first hybrid laminate consisted of co-curing quartz/cyanate ester (CE-3) prepreg to a cured quartz/rigid silicone laminate. The second hybrid laminate fabricated consisted of a thin, sprayed layer of tough rigid silicone resin onto a cured quartz/CE-3 laminate. The addition cure tough silicone resin was used.

A section of a fabricated quartz/tough rigid silicone laminate was used to fabricate the first hybrid laminate. Four (4) plies of 4581 Astroquartz III/CE-3 prepreg from COI-Materials were placed on the cured laminate and compacted for 30 minutes under vacuum at room temperature. The laminate was then placed between two (2) released aluminum plates and sealed. The laminate was then bagged as follows:
Nylon Vacuum Bag
Polyester Cloth Breather
Fluorinated Ethylene Polypropylene Release Film
Released Aluminum Plate
Hybrid Laminate
Released Aluminum Plate
Tetrafluoroethylene Coated Fiberglass Cloth (Armalon)
Stainless Steel Tool Curing of the laminate was performed as follows:
Leak check bag
Leak rate not to exceed 3 inches Hg loss in 5 minutes
Apply full system vacuum for duration of cure
Apply 100+/−10 psi pressure
Ramp part temperature to 350° F.+/−5° F. at 5–7° F./minute
Dwell at 350° F.+/−5° F. for 120 minutes+/−5 minutes.
Vent vacuum to atmosphere
Release pressure
Cool at 7° F./min maximum until part temperature reaches 150° F. or below
End cure Upon visual inspection of the first hybrid laminate, no noticeable disbonds were apparent between the layers of the tough rigid silicone and cyanate ester resin.

The second hybrid laminate was fabricated using a cured 4503 Astroquartz III/BTCy-1A CE laminate from Brtye Technologies, Inc. Several 4 in. by 4 in. samples were machined and double back taped to a flat aluminum plate. One sample was set aside as a baseline laminate with no tough rigid silicone resin. The silicone resin was mixed with 1 gram catalyst per 100 gram resin. The resin was then diluted with toluene at 25% by weight. The mixture was poured into a standard touch up gun and sprayed with an even coat onto each laminate. As each spray pass was completed, a laminate was removed from the aluminum plate until the last laminate remained. Consequently, the last laminate was the sample with the most resin. All laminates with sprayed resin were placed in an oven at 350° F. (177° C.) for 3 hours. After cure it can be noticed that the silicone resin is well cured and adhere to the cyanate ester resin well. No surface crack or micro-crack is noticed.

Figure 1:
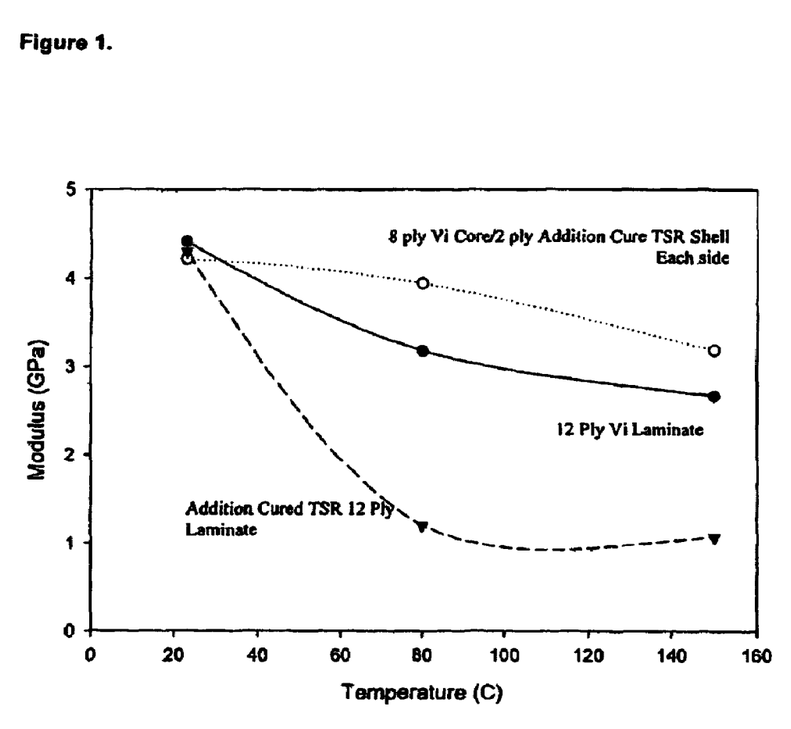
FIG. 1. Modulus Retention of Laminates at Elevated Temperatures

Vinyl Ester/Silicone resin hybrid laminates were fabricated by two representative processes: the co-cure process, and the sequential cure process. The co-cure and the sequential cure processes were explained earlier. The reinforcing fiber impregnated with silicone resin and vinyl ester resin is stacked according to the designed pattern and the cure process chosen. The stacked pre-preg is then enclosed in a vacuum bag and full vacuum is applied. This may be repeated at room temperature for better compaction. Once all pre-pregs are laid down full vacuum is applied and maintained through the curing process. The final curing temperature for both processes is 200° C. During the initial stage of the cure it may be needed to increase external pressure slowly to achieve a good resin flow without it being excessively squeezed out. The mechanical testing results for the composite sample are displayed in Tables 3 to 7 and FIG. 1. Table 3 lists in the first column the toughened silicone resin and organic resin used, as well as the temperature of the test. In this column the testing temperatures other than room temperature are specified. In the description column the number of layers of each resin is listed, as well as the type of curing used, either concurrent or sequential. Table 4 lists the mechanical properties of a vinyl ester resin composite and an addition cured silicone resin composite at various temperatures. Table 5 details the short beam shear strength of various composites. Tables 6 and 7 detail the flammability properties of the composite materials. FIG. 1 is a plot of the modulus as a function of temperature for various composites of the present invention.

TABLE 1

Resins Used in Examples

| Resin | Specification | Manufacturer |
|---|---|---|
| TSR B* | solventless, Pt catalyst | Dow Corning |
| TSR A** | 233 resin toughened with 10% PDMS, in toluene, ~63 wt % solid content, Dow Corning Y-177 catalyst (0.05 wt %–0.2 wt %) | Dow Corning |
| Epoxy Vinyl Ester | Derakane Momentum 470–300 Epoxy Vinyl Ester Resin, curing agents 0.5 wt % BPO (Benzoyl Peroxide) and 0.06 wt % DEA (Diethylaniline) | Dow Chemical |
| Epoxy | D.E.N. 438 Epoxy Novalac resin, curing agent 35.5 wt % DDS (Diamino Diphenyl Sulfone) | Dow Chemical |

*TSR stands for Toughened Silicone Resin;
TSR A: an example of condensation curable toughened silicone resins;
TSR B: an example of addition curable toughened silicone resins.

TABLE 2

Specifications of Organic Resins Used in Examples

| | Derakane Momentum 470–300 Epoxy novolac-based vinyl ester resin | Epoxy novolac D.E.N. 438 resin |
|---|---|---|
| Viscosity, cP | 300 at 25° C. | 22,500–50,000 at 52° C. |
| Specific Gravity | 1.08 | 1.22 @ 4° C. |
| Tg, °C. | — | 255 (cured with DDS) |
| Tensile Strength, psi (MPa) | 12,400 (85) | ~11,900 (82) |
| Tensile Modulus, msi (GPa) | 0.52 (3.6) | ~0.48 (3.25) |
| Elongation, % | 3.0–4.0 | — |
| Flexural strength, psi (MPa) | 19,000 (131) | 19,600 (135) |
| Flexural modulus, msi (GPa) | 0.55 (3.8) | 0.48 (3.31) |
| Flexural strain at yield, % | — | 7.0 |

TABLE 3

Properties of Hybrid Laminates with Vinyl Ester Core and Silicone Resin Surface

| ID | Fabric | Description | Thickness mm | Resin cont Wt. % | Loading rate mm/min | Strain at yld % | Stress at yld Ksi | Modulus Msi | Fill/Warp |
|---|---|---|---|---|---|---|---|---|---|
| 1126 ViB* | 7781 clean Surface | 8 × Vinyl Ester + 4 × B, seq cure | 2.35 | 24 | 1.83 | 2.39 ± 0.12 | 62.18 ± 2.12 | 3.61 ± 0.12 | warp |
| 1126 ViB 80° C. | 7781 clean Surface | 8 × Vinyl Ester + 4 × B, seq cure | 2.35 | 24 | 1.83 | 2.77 ± 0.09 | 43.72 ± 1.88 | 2.18 ± 0.31 | Warp |
| 0117 ViB | 7781 clean Surface | 8 × Vinyl Ester + 4 × B, seq cure | 2.81 | 33 | 1.53 | 2.34 ± 0.08 | 55.5 ± 2.8 | 3.02 ± 0.23 | warp |
| 0117 ViB 80° C. | 7781 clean Surface | 8 × Vinyl Ester + 4 × B, seq cure | 2.81 | 33 | 1.53 | 3.38 ± 0.07 | 41.08 ± 2.34 | 1.65 ± 0.09 | warp |
| 0117 ViB 150° C. | 7781 clean Surface | 8 × Vinyl Ester + 4 × B, seq cure | 2.81 | 33 | 1.53 | 3.21 ± 0.06 | 22.34 ± 1.97 | 1.52 ± 0.16 | warp |
| 1211 ViB | 7781 clean Surface | 8 × Vinyl Ester + 4 × B, co-cure | 2.2 | 23 | 1.95 | 2.22 ± 0.17 | 72.55 ± 6.42 | 4.22 ± 0.20 | fill |
| 1211 ViB 80° C. | 7781 clean Surface | 8 × Vinyl Ester + 4 × B, co-cure | 2.2 | 23 | 1.95 | 1.98 ± 0.11 | 61.48 ± 6.35 | 3.53 ± 0.34 | warp |
| 0115 ViB | 7781 clean Surface | 8 × Vinyl Ester + 4 × B, co-cure | 2.47 | 26 | 1.74 | 1.95 ± 0.07 | 74.94 ± 7.37 | 4.21 ± 0.51 | warp |
| 0115 ViB 80° C. | 7781 clean Surface | 8 × Vinyl Ester + 4 × B, co-cure | 2.47 | 26 | 1.74 | 1.78 ± 0.08 | 62.71 ± 2.37 | 3.94 ± 0.36 | warp |
| 0115 ViB 150° C. | 7781 clean Surface | 8 × Vinyl Ester + 4 × B, co-cure | 2.47 | 26 | 1.74 | 1.53 ± 0.11 | 46.43 ± 4.12 | 3.19 ± 0.06 | warp |
| 1217 Ester | 7781 clean Surface | 12 plies × vinyl ester | 2.18 | 24 | 1.97 | 1.70 ± 0.05 | 57.87 ± 2.72 | 3.83 ± 0.21 | fill |
| 0102 Ester 80° C. | 7781 clean Surface | 12 plies × vinyl ester | 2.00 | 21 | 2.14 | 1.08 ± 0.07 | 34.15 ± 2.33 | 3.72 ± 0.55 | fill |

TABLE 3-continued

Properties of Hybrid Laminates with Vinyl Ester Core and Silicone Resin Surface

| ID | Fabric | Description | Thickness mm | Resin cont Wt. % | Loading rate mm/min | Strain at yld % | Stress at yld Ksi | Modulus Msi | Fill/Warp |
|---|---|---|---|---|---|---|---|---|---|
| 0118 ViB | 7781 clean Surface | 6 × Vinyl Ester + 6 × B, seq cure | 2.67 | 34 | 1.61 | 1.91 ± 0.12 | 51.98 ± 1.25 | 3.07 ± 0.08 | warp |
| 0118 ViB 80° C. | 7781 clean Surface | 6 × Vinyl Ester + 6 × B, seq cure | 2.67 | 34 | 1.61 | 1.38 ± 0.06 | 20.12 ± 1.35 | 2.28 ± 0.20 | warp |
| 0118 ViB 150° C. | 7781 clean Surface | 6 × Vinyl Ester + 6 × B, seq cure | 2.67 | 34 | 1.61 | 3.75 ± 0.10 | 13.49 ± 0.92 | 1.28 ± 0.15 | warp |
| 0114 ViB | 7781 clean Surface | 6 × Vinyl Ester + 6 × B, co-cure | 2.53 | 28 | 1.70 | 2.19 ± 0.12 | 69.54 ± 1.98 | 3.52 ± 0.15 | warp |
| 0114 ViB 80° C. | 7781 clean Surface | 6 × Vinyl Ester + 6 × B, co-cure | 2.53 | 28 | 1.70 | 2.17 ± 0.06 | 54.23 ± 1.63 | 3.10 ± 0.18 | warp |
| 0114 ViB 150° C. | 7781 clean Surface | 6 × Vinyl Ester + 6 × B, co-cure | 2.53 | 28 | 1.70 | 2.10 ± 0.25 | 28.76 ± 3.91 | 2.13 ± 0.25 | warp |
| 0102 ViB | 7781 clean Surface | 8 × Vinyl Ester + 4 × B, seq cure | 2.1 | 23 | 2.02 | 2.22 ± 0.08 | 72.46 ± 1.58 | 4.71 ± 0.09 | warp |
| 0102 ViB | 7781 clean Surface | 8 × Vinyl Ester + 4 × B, seq cure | 2.1 | 23 | 2.02 | 2.22 ± 0.02 | 59.67 ± 0.94 | 3.78 ± 0.16 | fill |
| 0103 ViB | 7781 clean Surface | 8 × Vinyl Ester + 4 × B, co-cure | 2.2 | 26 | 1.95 | 2.08 ± 0.16 | 79.92 ± 8.24 | 4.73 ± 0.74 | warp |
| 0103 ViB | 7781 clean Surface | 8 × Vinyl Ester + 4 × B, co-cure | 2.2 | 26 | 1.95 | 2.04 ± 0.01 | 71.72 ± 0.88 | 4.10 ± 0.03 | fill |

*Vi stands for Vinyl Ester,
B stands for the addition cured toughened silicone resin.

TABLE 4

Mechanical Properties of Vinyl Ester and Condensation Cured Silicone Resin Composites at Different Temperatures

| ID | Fabric | Description | Thickness Mm | Resin cont wt. % | Loading rate mm/min | Flex strain % | Flex stress Ksi | Modulus msi |
|---|---|---|---|---|---|---|---|---|
| 1217 Vi* | 7781 clean | 12 plies × vinyl ester | 2.18 | 24 | 1.97 | 1.70 ± 0.05 | 57.87 ± 2.72 | 3.83 ± 0.21 |
| 0102 Vi 80° C. | 7781 clean | 12 plies × vinyl ester | 2.00 | 21 | 2.14 | 1.08 ± 0.07 | 34.15 ± 2.33 | 3.72 ± 0.55 |
| 0402Vi 20° C. | 7781 clean | 12 plies × vinyl ester | 2.37 | 27 | 1.82 | 1.68 ± 0.08 | 69.28 ± 2.85 | 4.40 ± 0.34 |
| 0402 Vi 80° C. | 7781 clean | 12 plies × vinyl ester | 2.37 | 27 | 1.82 | 1.67 ± 0.03 | 46.05 ± 2.24 | 3.18 ± 0.14 |
| 0402 Vi 150° C. | 7781 clean | 12 plies × vinyl ester | 2.37 | 27 | 1.82 | 1.49 ± 0.11 | 32.99 ± 0.79 | 2.66 ± 0.10 |
| 0116 B 20° C. | 7781 clean | 12 plies × B | 2.29 | 23 | 1.88 | 1.37 ± 0.05 | 43.17 ± 1.12 | 3.49 ± 0.06 |
| 0430 B20° C. | 7781 clean | 12 plies × B | 2.65 | 29 | 1.62 | 1.50 ± 0.28 | 42.81 ± 3.23 | 3.45 ± 0.85 |
| 0430 B 80° C. | 7781 clean | 12 plies × B | 2.65 | 29 | 1.62 | 1.15 ± 0.12 | 24.90 ± 3.30 | 2.80 ± 0.66 |
| 0430 B 150° C. | 7781 clean | 12 plies × B | 2.65 | 29 | 1.62 | 1.46 ± 0.09 | 8.22 ± 0.08 | 0.96 ± 0.09 |

*Vi stands for vinyl ester,
B stands for the addition cured toughened silicone resin.

TABLE 5

Short Beam Shear Strength of Laminates

| | First Measurement | | Repeat Experiment | |
|---|---|---|---|---|
| Sample | Resin Content % | Short Beam Shear Strength, Ksi | Resin Content % | Short Beam Shear Strength, Ksi |
| TSR/GF Laminate* | 29.0 | 3.00 | 29.4 | 3.00 |
| Vi/GF Laminate | 29.0 | 5.50 | 29.4 | 5.70 |
| 8 ply Vi/GF Core/2 ply TSR/GF Shell on Each Side | 28.5 | 6.63 | 31.1 | 6.51 |

*Abbreviations:
TSR: Addition Cured Toughened Silicone Resins.
GF: Glass Fabric
Vi: Vinyl Ester
All laminates are 12 pliers thick and have resin content of 28 to 29%.

TABLE 6

Cone Calorimetry Flammability Test Results for Glass Fabric Reinforced Laminates

| Matrix Resin | $t_{ig}$ (s) | Pk HRR (KW/m$^2$) | Avg. HRR 60 s (KW/m$^2$) | Avg. HRR 180 s (KW/m$^2$) | Avg. HRR 300 s (KW/m$^2$) | Avg. Eff. Hc (MJ/kg) | Avg. SEA (m$^2$/kg) |
|---|---|---|---|---|---|---|---|
| Vinyl Ester (Vi) | 44 | 349.0 | 284.8 | 141.4 | 94.8 | 24.1 | 1087 |
| 233T | 59 | 89.0 | 30.5 | 56.4 | 44.2 | 38.6 | 750 |
| TSR B* | 127 | 143.9 | 97.8 | 106.4 | 77.3 | 35.8 | 1485 |
| 8 Vi core plies 4 outer TSR B plies | 32 | 213.7 | 133.2 | 120.0 | 76.2 | 23.8 | 932 |
| 8 Vi Core Plies 4 outer TSR B plies | 47 | 228.1 | 190.8 | 93.4 | 59.4 | 24.4 | 934 |

* TSR B: same as the B in previous tables, the addition cured toughened silicone resin.
$t_{ig}$ = time to sustained ignition
Pk HRR = Peak Heat Release Rate
Avg. HRR = Average Heat Release Rate, After Ignition
Avg. Eff. Hc = Average Heat of Combustion
Avg. SEA = Average Specific Extinction Area

TABLE 7

Flammability of 7781 Glass Fabric Reinforced Laminates Tested According to OSU Testing Conditions

| Resin Matrix | Specimen Weight Grams | Specimen Thickness inch | Peak Heat Release Rate KW/m$^2$ | Time to Peak Heat Seconds | Total Heat Release rate at 2 min. kW.min./m$^2$ |
|---|---|---|---|---|---|
| TSR B | 127.00 | 0.118 | 42.2 | 301 | 10.4 |
| TSR B | 112.01 | 0.0902 | 31.1 | 212 | 10.8 |
| TSR A* | | | | | |
| Vi-12 ply | 110.93 | 0.0966 | 40.5 | 238 | 14.2 |
| 8Vi core plies 4outer TSR B plies | 120.18 | 0.110 | 35.7 | 292 | 10.7 |

*TSR A: the condensation cure toughened silicone resin

As can be seen from a comparison of the mechanical properties of the above tables, the composite material of the present invention has improved modulus retention at elevated temperatures when compared to the silicone resin itself. Unexpectedly the modulus retention is even better than the organic resin itself. A similar trend is observed with short beam shear strength. Repeat experiments confirm such an unexpected synergistic effect. The co-cured composites exhibited better retention of strength and modulus compared to the sequential cured composites, due to more effective reaction between the two resins at the interface.

With reference to tables 6 and 7, the flammability properties of the composite material are better than the organic resin composites in terms of peak heat release rate, average heat release rate, and smoke generation as indicated by the average specific extinction area.

While a preferred embodiment is disclosed, a worker in this art would understand that various modifications would come within the scope of the invention. Thus, the following claims should be studied to determine the true scope and content of this invention.

What is claimed is:

1. A fiber reinforced composite comprising:
   a plurality of layers of fibers, each layer being impregnated with a resin and,
   wherein the plurality of layers comprises in combination at least a layer of a toughened silicone resin comprising a hydrosilylation reaction curable composition including: a) a silsesquioxane polymer; b) a mixture of silane and/or siloxane cross-linking compounds; and c) a hydrosilylation reaction catalyst and a layer of an organic resin selected from the group consisting of vinyl ester resins, epoxy resins, phenolic resins, and cyanate ester resins, forming a hybrid composite having a higher modulus retention at elevated temperatures than a composite using the toughened silicone resin alone.

2. The fiber reinforced composite of claim 1 wherein the silsesquioxane polymer comprises a copolymer resin.

3. The fiber reinforced composite of claim 2 wherein the copolymer resin comprises, a copolymer resin having the empirical formula $R^1{}_aR^2{}_bR^3{}_cSiO_{(4-a-b-c)/2}$, wherein: a is zero or a positive number, b is zero or a positive number, c is zero or a positive number, with the provisos that $0.8 \leq (a+b+c) \leq 3.0$ and component (A) has an average of at least 2 $R^1$ groups per molecule, and each $R^1$ is independently selected from monovalent hydrocarbon groups having aliphatic unsaturation, and each $R^2$ and each $R^3$ are independently selected from monovalent hydrocarbon groups and hydrogen.

4. The fiber reinforced composite of claim 3 wherein the silsesquioxane resin comprises $(PhSiO_{3/2})_{0.75}(ViMe_2SiO_{1/2})_{0.25}$, where Ph is a phenyl group, Vi represents a vinyl group, and Me represents a methyl group.

5. The fiber reinforced composite of claim 1 wherein the mixture of cross-linking compounds is formed of silanes or siloxanes having at least two silicon hydride functionalities.

6. The fiber reinforced composite of claim 1 wherein the plurality of layers of fibers comprise woven fabrics of fibers of a material selected from the group consisting of aramid resins, polyester resins, nylon resins, carbon, glass and quartz.

7. The fiber reinforced composite of claim 1 wherein the composite comprises alternating layers of the silicone resin and the organic resin.

8. The fiber reinforced composite of claim 7 wherein the toughened silicone layers comprise exterior layers of the composite.

9. The fiber reinforced composite of claim 1 wherein the composite comprises a core of organic resin layers surrounded by a shell of toughened silicone resin layers.

10. The fiber reinforced composite of claim 1 wherein the composite comprises a core of alternating layers of organic and silicone layers surrounded by a shell of toughened silicone layers.

11. The fiber reinforced composites of claim 1 wherein the composite comprises a core of honeycomb surrounded by organic and toughened silicone resin layers.

12. A fiber reinforced composite comprising:
a plurality of layers of fibers, each layer being impregnated with a resin and,
wherein the plurality of layers comprises in combination at least a layer of a toughened silicone resin, the toughened silicone resin comprising a condensation reaction curable composition comprising:
an organosilicone composition comprising:
(I) an organosilicone resin of the empirical formula $R1_aR^2{}_bR^3{}_cSiO_{(4-a-b-c)/2}$ wherein: a is a positive numerical value, b and c are zero or positive numerical values with the proviso that $0.8 \leq (a+b+c) \leq 1.6$, $R^1$, $R^2$ and $R^3$ are monovalent radicals independently selected from the group consisting of hydrogen, hydroxyl, alkyl, alkenyl, alkoxy, oximo, alkyloximo, aryloximo, aryl, alkylepoxide, arylepoxide, alkylcarboxyl, arylcarboxyl, alkylether, arylether, alkylamido arylamido, alkyl amino and arylamino radicals wherein the organosilicone composition contains at least one condensable monovalent radical, and
further includes a silicone rubber of the empirical formula:

wherein each $R^4$ is a monovalent radical independently selected from the group consisting of alkyl and aryl radicals, each $R^5$ is a monovalent radical independently selected from the group consisting of hydrogen, hydroxyl, alkenyl, alkoxy, oximo, alkyloximo, aryloximo, alkylepoxide, arylepoxide, alkylcarboxyl, arylcarboxyl, alkylamido, arylamido, alkyl amino and arylamino radicals, p is 1, 2 or 3, q is 1 or 2, x is greater than or equal to 6, and y ranges from zero to 10; and
a layer of an organic resin selected from the group consisting of vinyl ester resins, epoxy resins, phenolic resins, and cyanate ester resins, forming a hybrid composite having a higher modulus retention at elevated temperatures than a composite using the toughened silicone resin alone.

13. The fiber reinforced composite of claim 12 wherein the plurality of layers of fibers comprise woven fabrics of fibers of a material selected from the group consisting of aramid resins, polyester resins, nylon resins, carbon, glass and quartz.

14. The fiber reinforced composite of claim 12 wherein the composite comprises alternating layers of the toughened silicone resin and the organic resin.

15. The fiber reinforced composite of claim 14 wherein the toughened silicone layers comprise exterior layers of the composite.

16. The fiber reinforced composite of claim 12 wherein the composite comprises a core of organic resin layers surrounded by a shell of toughened silicone resin layers.

17. The fiber reinforced composite of claim 12 wherein the composite comprises a core of alternating layers of organic and silicone layers surrounded by a shell of toughened silicone layers.

18. The fiber reinforced composites of claim 12 wherein the composite comprises a core of honeycomb surrounded by organic and toughened silicone resin layers.

* * * * *

UNITED STATES PATENT AND TRADEMARK OFFICE
CERTIFICATE OF CORRECTION

| | | |
|---|---|---|
| PATENT NO. | : 7,037,592 B2 | Page 1 of 1 |
| APPLICATION NO. | : 10/374802 | |
| DATED | : May 2, 2006 | |
| INVENTOR(S) | : Zhu et al. | |

It is certified that error appears in the above-identified patent and that said Letters Patent is hereby corrected as shown below:

On Title Page
Item
"(73) Assignee: Dow Corning Corporation, Midland, MI (US)" should read --(73) Assignee: Massachusetts Institute of Technology, Cambridge, Massachusetts and Dow Corning Corporation, Midland, Michigan--.

Signed and Sealed this

Twenty-seventh Day of November, 2007

JON W. DUDAS
*Director of the United States Patent and Trademark Office*